US012621927B2

(12) United States Patent (10) Patent No.: US 12,621,927 B2
Yamamoto et al. (45) Date of Patent: May 5, 2026

(54) CIRCUIT BOARD, SEMICONDUCTOR DEVICE, AND METHOD FOR MANUFACTURING SEMICONDUCTOR DEVICE

(71) Applicant: Kioxia Corporation, Tokyo (JP)

(72) Inventors: Takashi Yamamoto, Yokohama Kanagawa (JP); Soichiro Ibaraki, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 452 days.

(21) Appl. No.: 18/179,408

(22) Filed: Mar. 7, 2023

(65) Prior Publication Data

US 2024/0090125 A1 Mar. 14, 2024

(30) Foreign Application Priority Data

Sep. 14, 2022 (JP) ................................. 2022-146022

(51) Int. Cl.
| | |
|---|---|
| *H01L 23/00* | (2006.01) |
| *H05K 1/02* | (2006.01) |
| *H05K 1/11* | (2006.01) |
| *H05K 1/181* | (2026.01) |
| *H05K 3/321* | (2026.01) |
| *H05K 3/341* | (2026.01) |
| *H05K 3/00* | (2006.01) |
| *H05K 3/28* | (2006.01) |
| *H10B 80/00* | (2023.01) |

(52) U.S. Cl.
CPC ........... *H05K 1/0268* (2013.01); *H05K 1/111* (2013.01); *H05K 1/181* (2013.01); *H05K 3/321* (2013.01); *H05K 3/3442* (2013.01);

*H05K 3/0052* (2013.01); *H05K 3/284* (2013.01); *H05K 2201/10015* (2013.01); *H05K 2203/16* (2013.01); *H10B 80/00* (2023.02)

(58) Field of Classification Search
CPC ......... H01L 23/49822; H01L 23/49838; H01L 23/3128; H01L 25/16
See application file for complete search history.

(56) References Cited

U.S. PATENT DOCUMENTS

| | | |
|---|---|---|
| 8,912,802 B2 | 12/2014 | Sakurai et al. |
| 10,593,480 B2 | 3/2020 | Yamamoto et al. |
| 2005/0090041 A1 | 4/2005 | Dishongh et al. |
| | (Continued) | |

FOREIGN PATENT DOCUMENTS

| | | |
|---|---|---|
| CN | 103337487 A | 10/2013 |
| CN | 115020373 A | 9/2022 |
| | (Continued) | |

*Primary Examiner* — Reema Patel
(74) *Attorney, Agent, or Firm* — Holtz, Holtz & Volek PC

(57) ABSTRACT

A circuit board is a wiring board frame in which a plurality of wiring boards in each of which a pair of lands electrically connected to a capacitor are formed on a first surface are arranged side by side. In the wiring board frame, an inspection path is formed. The inspection path passes between the pair of lands provided on each of the plurality of wiring boards. The inspection path includes a first wiring including one end between the pair of lands, and a second wiring including one end between the pair of lands, and the one end of the first wiring and the one end of the second wiring are formed to be separated from each other.

5 Claims, 23 Drawing Sheets

(56) References Cited

U.S. PATENT DOCUMENTS

| 2013/0037911 | A1* | 2/2013 | Hattori ............. H01L 23/49805 |
| | | | 257/532 |
| 2013/0215591 | A1 | 8/2013 | Babala et al. |
| 2017/0287853 | A1* | 10/2017 | Kim .................... H01L 23/3128 |
| 2020/0168540 | A1 | 5/2020 | Okayasu et al. |
| 2020/0373306 | A1 | 11/2020 | Kim et al. |
| 2022/0059493 | A1 | 2/2022 | Okada et al. |
| 2024/0047326 | A1 | 2/2024 | Chen et al. |

FOREIGN PATENT DOCUMENTS

| JP | 2020088139 | A | 6/2020 | |
| JP | 2022034947 | A | 3/2022 | |
| WO | WO-2023021888 | A1 * | 2/2023 | ......... H01L 23/3121 |

* cited by examiner

CIRCUIT BOARD, SEMICONDUCTOR DEVICE, AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2022-146022 filed on Sep. 14, 2022; the entire contents of which are incorporated herein by reference.

FIELD

Embodiments described herein relate generally to a circuit board, a semiconductor device, and a method for manufacturing the semiconductor device.

BACKGROUND

As a countermeasure for noise during high-speed operation, a semiconductor device has been proposed in which a capacitor as well as a semiconductor chip is provided on a wiring board. However, occurrence of physical poor connections (tombstones, detachments, and the like) between the capacitors and the wiring boards has become a problem.

DETAILED DESCRIPTION

A circuit board of a present embodiment is a circuit board including a plurality of wiring boards each including a first surface and a second surface that is on an opposite side to the first surface. The plurality of wiring boards are arranged with the first surface of each of the plurality of wiring boards aligned in a same direction. Each of the plurality of wiring boards includes a pair of electrodes electrically connected to an electronic component, on the first surface. In the circuit board, an inspection path is formed. The inspection path includes a first wiring including one end between the pair of electrodes, and a second wiring including one end between the pair of electrodes, and the one end of the first wiring and the one end of the second wiring are formed to be separated from each other.

Hereinafter, the embodiment will be described with reference to the drawings.

In the following explanation, an XYZ coordinate system that is an example of an orthogonal coordinate system is used. In other words, a plane parallel to a surface of a wiring board 40 configuring a semiconductor device 100 is defined as an XY plane, and a direction orthogonal to the XY plane is defined as a Z axis. Two orthogonal directions in the XY plane are defined as an X axis and a Y axis, respectively. Note that in the below, for convenience of explanation, an up-down direction of the wiring board will be described by using a relative up-down relationship in which a surface on which a semiconductor chip is provided is defined as an upper side.

Figure 1:
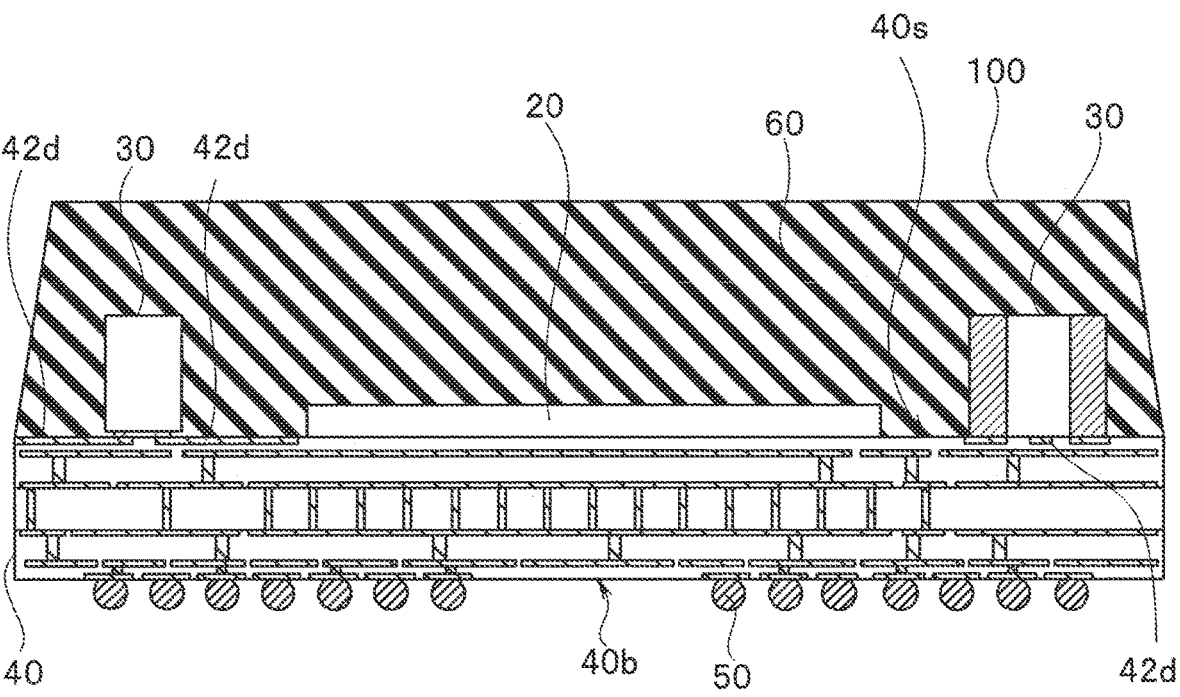
FIG. 1 is a cross-sectional view schematically showing an example of a semiconductor device of an embodiment.
Figure 1:

FIG. 1 is a cross-sectional view schematically showing an example of a semiconductor device of the embodiment. Note that ratios among constituent elements configuring the semiconductor device shown in FIG. 1 differ from actual ratios. The semiconductor device 100 of the embodiment is a semiconductor package formed by sealing components such as semiconductor chips and capacitors that are mounted on a wiring board with mold resin, for example. The semiconductor device 100 includes a controller chip 20 as a semiconductor chip, a capacitor 30, the wiring board 40, a solder ball 50, and mold resin 60. The mold resin 60 is an example of sealing resin. The semiconductor device 100 also includes NAND type flash memory chips (hereinafter, referred to as memory chips) as the semiconductor chip on one side (back side in FIG. 1) in the Y direction of the controller chip 20.

The wiring board 40 is an insulating resin wiring board, a ceramic wiring board or the like in which wiring layers are provided on a surface and inside, for example. The wiring board 40 includes a first surface 40s and a second surface 40b. On the first surface 40s, the controller chip 20, the capacitor 30, and a memory chip 10 are provided. The capacitor 30 is an example of an electronic component. On the second surface 40b, the solder ball 50 as an external terminal for a BGA package is formed. The solder ball 50 is an example of an external equipment connecting terminal. The wiring board 40 has a plurality of wiring layers that are stacked, and on a wiring layer on an uppermost layer, a wiring 42d is formed. The wiring 42d is a part of an inspection path 42 that is used to electrically inspect a physical connection state of the capacitor 30 and the wiring board 40 and is formed across an underneath of the capacitor 30. The inspection path 42 will be described in detail later.

Figure 2A:
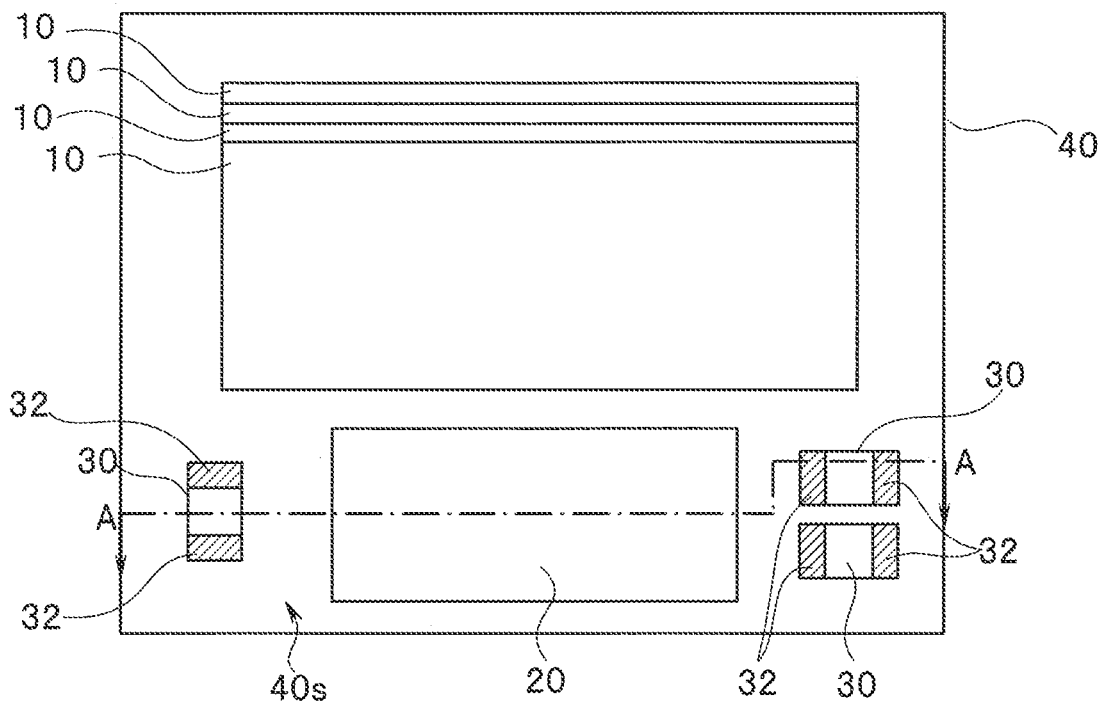
FIG. 2A is a schematic view explaining an example of an arrangement of semiconductor chips and capacitors that are mounted on a wiring board of the embodiment, which is a top view of the wiring board on which the semiconductor chips and the capacitors are arranged seen from above a first surface.
Figure 2A:
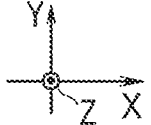
Figure 2B:
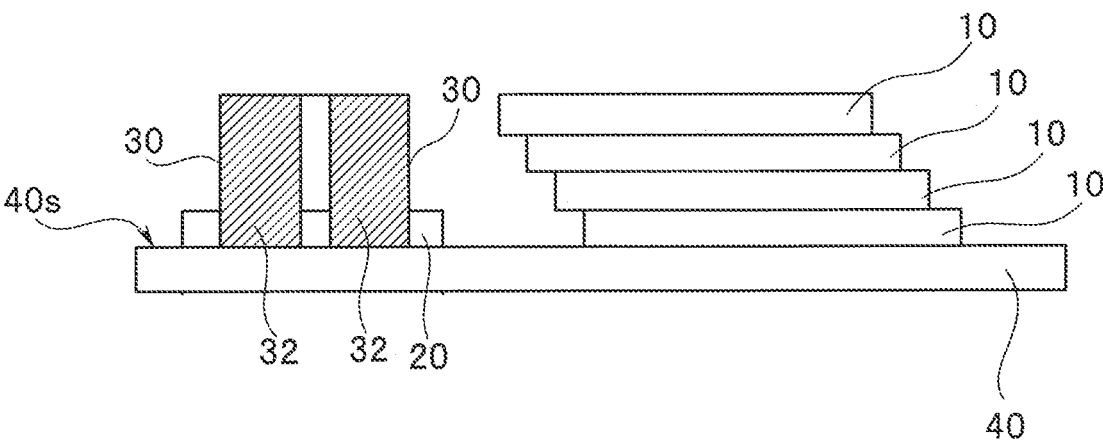
FIG. 2B is a schematic view explaining the example of the arrangement of the semiconductor chips and the capacitors that are mounted on the wiring board of the embodiment, which is a side view of the wiring board on which the semiconductor chips and the capacitors are arranged seen from a front side in an X direction.
Figure 2B:
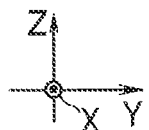

FIG. 2A and FIG. 2B are views explaining an example of an arrangement of the semiconductor chips and the capacitors that are mounted on the wiring board of the embodiment. FIG. 2A is a top view of the wiring board on which the semiconductor chips and the capacitors are arranged seen from above the first surface. FIG. 2B is a side view of the wiring board on which the semiconductor chips and the capacitors are arranged seen from one side in an X direction (paper surface right side in FIG. 2A). Note that FIG. 1 shows a cross-section in a case in which the semiconductor device 100 manufactured by using the wiring board on which the semiconductor chips and the capacitors are arranged shown in FIG. 2A is cut at a position shown by A-A in FIG. 2A.

As shown in FIG. 2A, on the wiring board 40, memory chips 10, the controller chip 20, and the capacitors 30 are mounted. There are a plurality of memory chips 10, and each of the memory chips 10 is a thin plate with a plane having a rectangular shape. The plurality of memory chips 10 are arranged by being stacked in a Z direction. As shown in FIG. 2B, for example, two of the memory chips 10 arranged adjacently to each other up and down in the Z direction are arranged to be shifted in the Y direction. The plurality of memory chips 10 are arranged on the first surface 40s of the wiring board 40 so that a direction of thicknesses of thin plates are parallel to the Z direction, and long sides are parallel to the X direction. More specifically, the plurality of memory chips 10 are arranged in a substantially center of the wiring board 40 in the X direction. The plurality of memory chips 10 are arranged in positions shifted to one side (upper side in FIG. 2A) from the substantially center of the wiring board 40 in the Y direction. In other words, a part of a top surface of each of the memory chips 10 is arranged so as not to be covered with other memory chips 10. Note that in FIGS. 2A and 2B, four of the memory chips 10 are stacked, but a stacking number of the memory chips 10 is not particularly limited.

The controller chip 20 is a thin plate having a rectangular plane shape. The controller chip 20 is arranged on the first surface 40s of the wiring board 40 so that a thickness direction of a thin plate is parallel to the Z direction, and a long side is parallel to the X direction. More specifically, the controller chip 20 is arranged on one side (lower side in FIG. 2A) in the Y direction from the memory chips 10 so as not to overlap the memory chips 10 in the Z direction. In other words, in the Y direction, the controller chip 20 is arranged to be separated from the memory chips 10. In the X direction, the controller chip 20 is arranged in the substantially center of the wiring board 40. Note that a length of a short side of the controller chip 20 is formed to be shorter than a length of a short side of the memory chip 10.

A plurality of capacitors 30 each has a rectangular parallelepiped shape. The plurality of capacitors 30 are arranged so that bottom surfaces of the individual capacitors 30 face the first surface 40s, in the first surface 40s of the wiring board 40. In an example shown in FIG. 2A, in the X direction, the plurality of capacitors 30 are arranged in spaces on both sides of the controller chip 20. Each of the capacitors 30 is arranged so as not to overlap the other capacitors 30, the controller chip 20, and the memory chips 10 in the Z direction. In the capacitor 30 that is arranged on one side (left side in FIG. 2A) in the X direction, of the controller chip 20, a long side of the bottom surface is arranged parallel to the Y direction. In the capacitors 30 arranged on the other side (right side in FIG. 2A) in the X direction, of the controller chip 20, long sides of the bottom surfaces are arranged parallel to the X direction. In other words, the capacitors 30 arranged on the other side in the X direction of the controller chip 20 has a positional relationship in which the capacitors 30 are rotated 90 degrees in the XY plane with respect to the capacitor 30 arranged on the one side. As shown in FIGS. 2A and 2B, a plurality of capacitors 30 arranged on the other side in the X direction, of the controller chip 20 are arranged in a same position in the X direction, with a space from each other in the Y direction. Note that FIG. 2A shows an example in which three capacitors 30 are arranged, but a number of the capacitors 30 is not particularly limited. In the capacitor 30, external electrodes 32 are formed on a pair of surfaces (hereinafter, referred to as end surfaces) that are surfaces orthogonal to a bottom surface, and face each other in a long side direction of the bottom surface. The external electrodes 32 are also formed on part of the bottom surface and a top surface by extending from the end surfaces.

Figure 3:
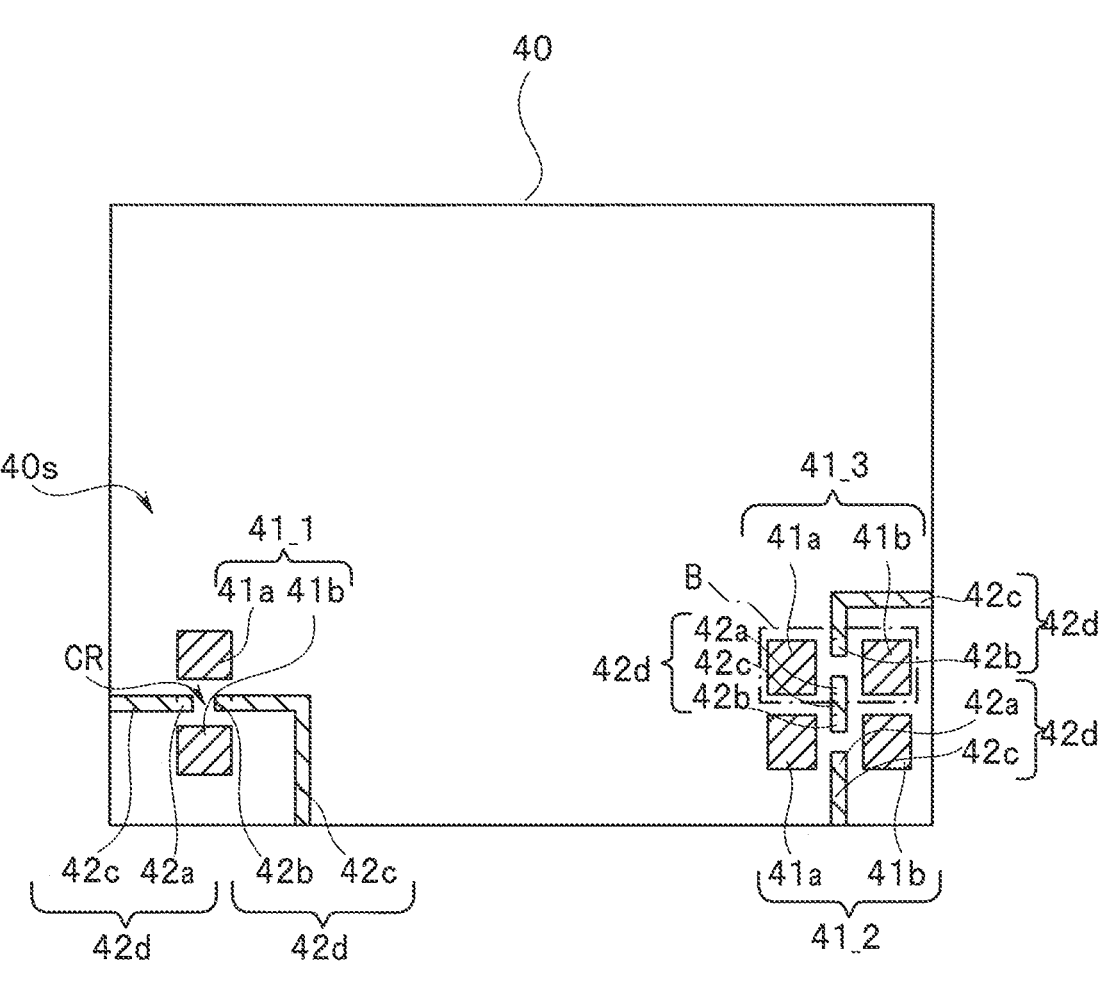
FIG. 3 is a plan view explaining an example of an arrangement of an inspection path in the wiring board of the embodiment.
Figure 3:
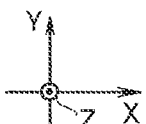

FIG. 3 is a plan view explaining an example of an arrangement of an inspection path in the wiring board of the embodiment. In a wiring layer of the wiring board 40, the wiring 42d is provided. The wiring 42d is a part of the inspection path 42 for inspecting a physical connection state of the capacitor 30 and the wiring board 40. Note that on the first surface 40s of the wiring board 40, terminals (electrodes) and the like for electrically connecting the memory chips 10 and the controller chip 20, and the wiring board 40 are also provided, but FIG. 3 shows only electrodes 41 for electrically connecting the capacitors 30 and the wiring board 40, and the wirings 42d, and illustration of other wirings and terminals is omitted.

On the first surface 40s of the wiring board 40, electrodes 41_1, 41_2, and 41_3 for connecting the capacitors 30 and the wiring board 40 are formed. Hereinafter, the electrodes 41_1, 41_2, and 41_3 are simply referred to as the electrodes 41 when the electrodes 41_1, 41_2, and 41_3 need not be distinguished. The one capacitor 30 has the two external electrodes 32, a positive side terminal and a negative side terminal. Therefore, the electrode 41 has two lands 41a and 41b that correspond to the respective external electrodes 32. The lands 41a and 41b are arranged to be separated from each other, and before the capacitor 30 is mounted, the lands 41a and 41b are electrically and physically disconnected. When the capacitor 30 is mounted on the wiring board 40, and the two external electrodes 32 are connected to the lands 41a and 41b respectively, the land 41a and the land 41b are electrically connected via the capacitor 30.

On the first surface 40s of the wiring board 40, a plurality of wirings 42d that are part of the inspection path 42 are formed. At least one end of each of the wirings 42d is arranged between the land 41a and the land 41b. Between the land 41a and the land 41b, end portions of two different wirings 42d are arranged to face each other.

Figure 4:
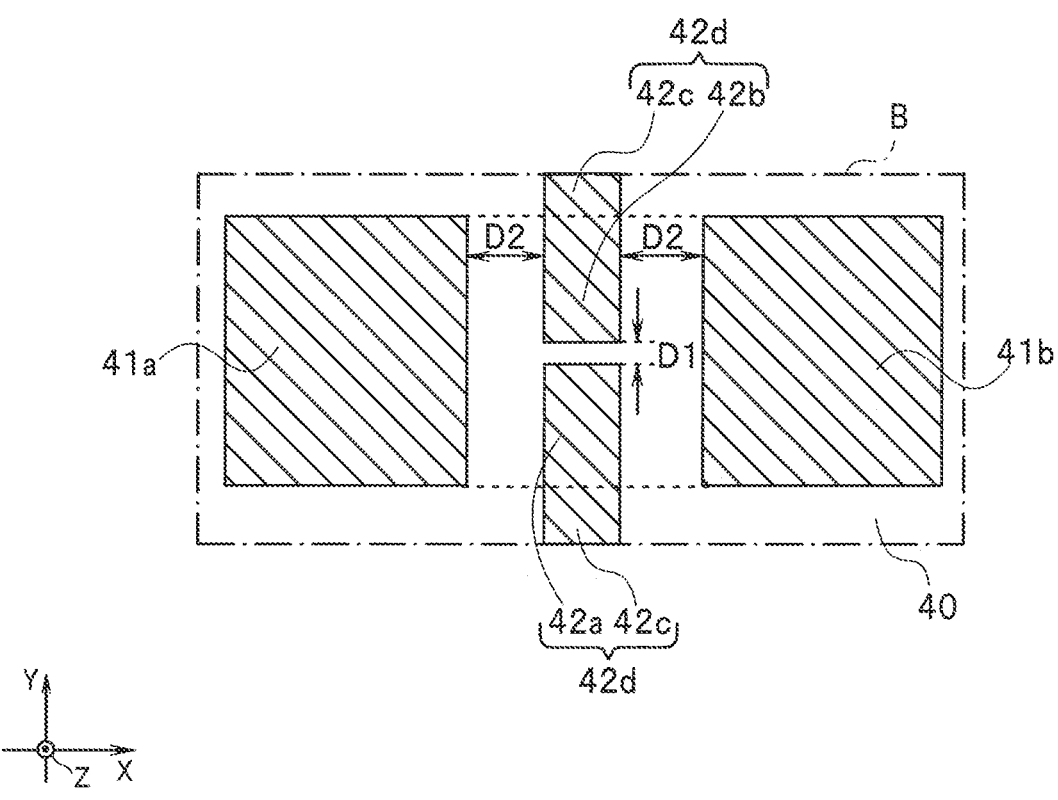
FIG. 4 is an enlarged plan view of a rectangular region B surrounded by a dotted line in FIG. 3.

FIG. 4 is an enlarged plan view of a rectangular region B surrounded by a dotted line in FIG. 3. FIG. 4 is a view explaining a positional relationship of the lands 41a and 41b, and the wirings 42d. Each of the two wirings 42d is arranged with one end of each other separated in a region between the land 41a and the land 41b. The wiring 42d has a first wiring 42a, a second wiring 42b, and a third wiring 42c. The first wiring 42a and the second wiring 42b are partial wirings of the wiring 42d that are formed in the region between the land 41a and the land 41b. In other words, lines (dotted lines in FIG. 4) connecting one ends of sides facing each other of the land 41a and land 41b are defined as boundaries, and the partial wirings of the wirings 42d that are formed between the land 41a and the land 41b are the first wiring 42a and the second wiring 42b. Widths of the first wiring 42a and the second wiring 42b are respectively formed to be narrower than a separation distance of the land 41a and the land 41b. In other words, the wiring 42d is arranged to be separated from the lands 41a and 41b. In FIG. 4, the wiring 42d is formed to be separated by a distance D2 from each of the lands 41a and 41b. One end of the first wiring 42a of one of the wirings 42d faces one end of the second wiring 42b of the other one of the wirings 42d. A distance between the end portion of the first wiring 42a and the end portion of the second wiring 42b is set to a distance D1. How to determine the distances D1 and D2 will be described in detail later.

The third wirings 42c are classified into the following two groups. When the third wiring 42c is a partial wiring of the wiring 42d including either one of the first wiring 42a or the second wiring 42b, the third wiring 42c is classified into a first group. One end of the third wiring 42c that is classified into the first group is located on a peripheral edge of the wiring board 40. When the third wiring 42c is a partial wiring of the wiring 42d including both the first wiring 42a and the second wiring 42b, the third wiring 42c is classified into a second group.

For example, in FIG. 3, between the lands 41a and 41b configuring the electrode 41_1 located on a lower left of the first surface 40s, the two wirings 42d are formed to face each other. Of the two wirings 42d, the wiring 42d arranged on one side (left side in FIG. 3) in the X direction includes the first wiring 42a and the third wiring 42c. Therefore, the third wiring 42c included in the wiring 42d belongs to the first group. The wiring 42d arranged on the other side (right side in FIG. 3) in the X direction includes the second wiring 42b and the third wiring 42c. Accordingly, the third wiring 42c included in the wiring 42d also belongs to the first group.

Of the aforementioned two third wirings 42c, the third wiring 42c arranged on the one side (left side in FIG. 3) in the X direction is formed rectilinearly along the X direction. The third wiring 42c arranged on the other side (right side in FIG. 3) in the X direction extends along the X direction and has a bent portion midway. The third wiring 42c changes an extending direction in the bent portion, extends along the Y direction beyond the bent portion to be formed to the peripheral edge of the wiring board 40. In this way, the third wiring 42c may be formed rectilinearly, or may have the bent portion midway.

Further, for example, in FIG. 3, between the lands 41a and 41b configuring the electrode 41_2 located on a lower right of the first surface 40s, the end portions of the two wirings 42d are formed to face each other. Of the two wirings 42d, the wiring 42d arranged on one side (lower side in FIG. 3) in the Y direction includes the first wiring 42a and the third wiring 42c. Accordingly, the third wiring 42c included in this wiring 42d belongs to the first group. The wiring 42d arranged on the other side (upper side in FIG. 3) in the Y direction includes the first wiring 42a, the second wiring 42b, and the third wiring 42c. Accordingly, the third wiring 42c included in the wiring 42d belongs to the second group.

Note that the third wiring 42c belonging to the second group may also be formed rectilinearly or may have a bent portion midway, similarly to the third wirings 42c belonging to the first group.

A number and positions of the third wirings 42c that are arranged differ according to the number and positions of the capacitors 30 that are mounted on the wiring board 40. However, regardless of the number and the positions of the capacitors 30, two or more of the third wirings 42c belonging to the first group are arranged on the wiring board 40. In other words, two or more of the wirings 42d each having one end on the peripheral edge of the wiring board 40 are arranged.

Figure 5:
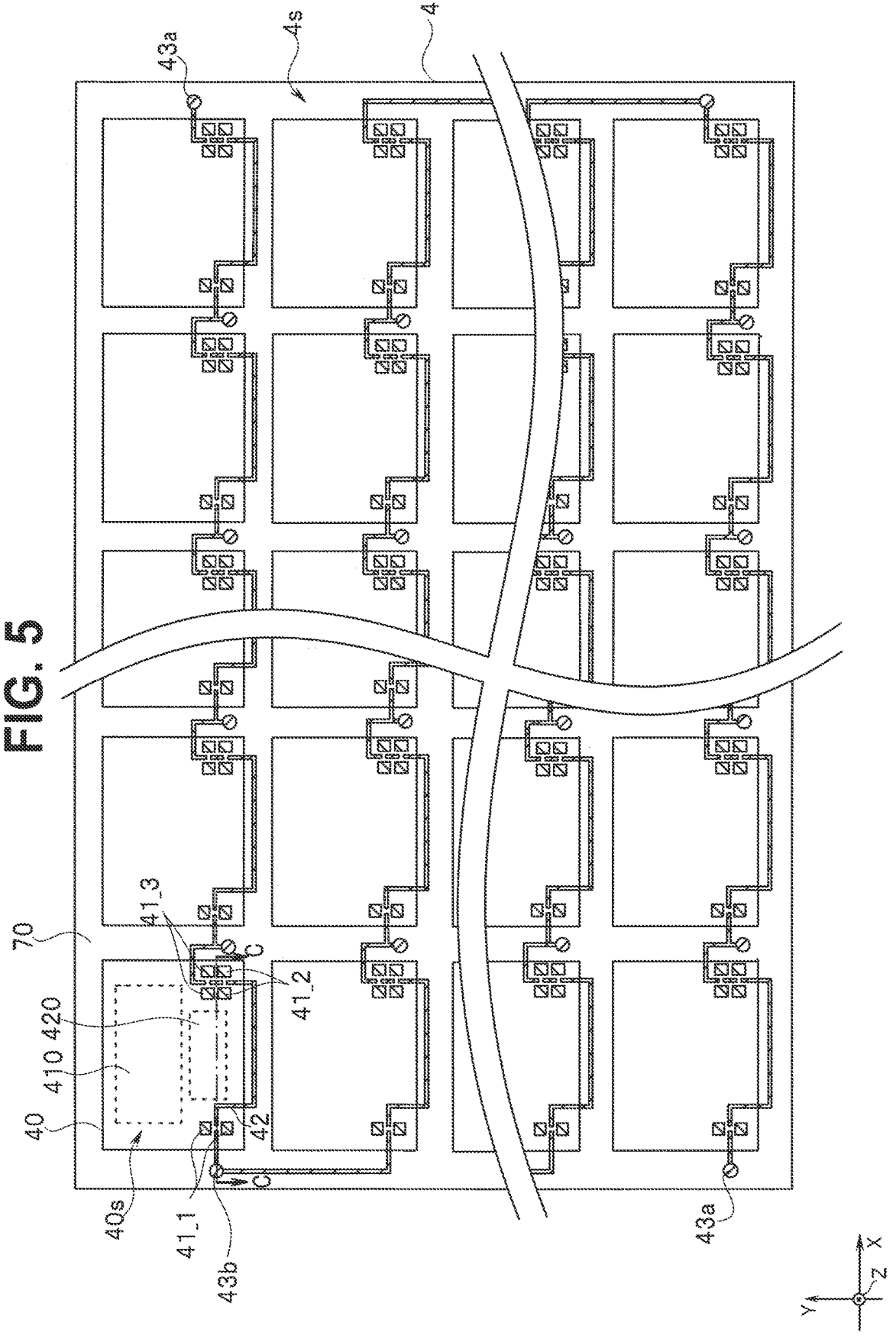
FIG. 5 is a plan view explaining an example of a layout of the inspection path in a wiring board frame of the embodiment.

The semiconductor device of the embodiment is manufactured by using a wiring board for forming multiple wiring boards (hereinafter, referred to as a wiring board frame 4) on which a plurality of wiring boards 40 are arranged in a matrix form. FIG. 5 is a plan view explaining an example of a layout of inspection wirings in the wiring board frame of the embodiment. The wiring board frame 4 is an example of a circuit board. For example, in 5 rows in the Y direction and 20 columns in the X direction, 100 wiring boards 40 in total are arranged. In the wiring board frame 4, a periphery of each of the wiring boards 40 is surrounded by a gap region 70. The gap region 70 is a region that is discarded when the semiconductor devices are divided by dicing. In each of the wiring boards 40, the electrode 41 that is connected to the external electrode 32 of the capacitor 30, and the inspection path 42 are formed on the first surface 40s except for a region 410 on which the memory chip is mounted, and a region 420 on which the controller chip is mounted. In the gap region 70, an inspection terminal 43 and the inspection path 42 are formed on a surface (hereinafter, referred to as a first surface 70s) located on a same side as the first surface 40s of the wiring board 40. In the following explanation, in the gap region 70, a surface located on a same side as the second surface 40b of the wiring board 40 will be referred to as a second surface 70. Further, a surface of the wiring board frame 4 including the first surface 40s and the first surface 70s is referred to as a first surface 4s, and a surface of the wiring board frame 4 including the second surface 40b and the second surface 70b is referred to as a second surface 4b.

The inspection path 42 is formed to be a single wiring without branches when the first wiring 42a and the second wiring 42b facing each other between the electrodes 41 are electrically connected, in the first surface 4s of the wiring board frame 4. The inspection path 42 is formed so that the electrodes 41 mounted on each of the wiring boards 40 are arranged in series in the path. The inspection path 42 is formed so that all the wiring boards 40 are arranged in series in the path. The inspection terminal 43 includes an inspection terminal 43a and an inspection terminal 43b. The inspection terminals 43a are formed at a start point and an end point of the inspection path 42 formed in series. The inspection terminals 43b are formed midway in the inspection path 42. More specifically, the inspection terminal 43b is formed midway in a wiring connecting the two third wirings 42c arranged in the different wiring boards 40.

After the capacitor 30 is mounted on each of the wiring boards 40 of the wiring board frame 4, inspection of a physical poor connection of the wiring board 40 and the capacitor 30 is performed. As the physical poor connection of the wiring board 40 and the capacitor 30, for example, a detachment and a tombstone are cited. The tombstone is a phenomenon in which one end side of the capacitor 30 floats and is not connected when the capacitor 30 is mounted on the wiring board 40. More specifically, measurement of a DC resistance value between the inspection terminals 43a formed at the start point and the end point of the inspection path 42 is performed. A conductor 33 is formed on a bottom surface (surface facing the first surface 40s of the wiring board 40) of the capacitor 30. (A configuration of the capacitor 30 will be described in detail later.) When the capacitor 30 is connected to all the electrodes 41 formed on the first surface 40s of the wiring board 40, one end of the first wiring 42a and one end of the second wiring 42b that are formed to be separated between the lands 41a and 41b of the electrode 41 are electrically connected via the conductor 33. When a physical poor connection occurs between the capacitor 30 and the electrodes 41 due to a tombstone, detachment or the like, the one end of the first wiring 42a and the one end of the second wiring 42b are not electrically connected.

After the capacitor 30 is mounted on each of the wiring boards 40 of the wiring board frame 4, the DC resistance value between the inspection terminals 43a formed on both the ends of the inspection path 42 is measured, and when the DC resistance value is lower than a set threshold value, it is determined that all the capacitors 30 mounted on the wiring board frame 4 are physically connected to (the terminals 41 of) the wiring boards 40. When the DC resistance value is equal to or larger than the set threshold value, it is determined that a physical poor connection occurs to any of the capacitors 30. By subsequently measuring a DC resistance value between freely selected terminals by using the inspection terminal 43b formed midway in the inspection path 42, it is possible to identify the wiring board 40 on which the capacitor 30 where a poor connection occurs is mounted. When the wiring board 40 is identified, the capacitor 30 where the physical poor connection occurs is detected by an image inspection, for example.

A method is generally used, in which an image obtained by picking up an image of the first surface 4s of the wiring board frame 4 from a top surface (or a transmission image by using X-rays or the like) is obtained, and a poor connection of the capacitor 30 is detected by an image recognition program or a visual inspection. However, the inspection method using an image, in particular, the method by visual inspection has a problem that the results vary depending on an inspector. There is a problem that when the number of capacitors 30 mounted on the wiring board frame 4 increases, the inspection time period increases and inspection efficiency decreases. In a case of performing a sampling inspection, there is also a problem that poor connections in uninspected locations cannot be detected. In contrast, according to the semiconductor device 100 of the embodiment, it is possible to detect presence or absence of the physical poor connection of all the capacitors 30 efficiently in a short time period, regardless of the number of capacitors 30 mounted on the wiring board frame 4.

Figure 6:
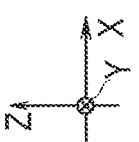
FIG. 6 is a cross-sectional view along line C-C of the wiring board frame shown in FIG. 5.

Next, a structure of the wiring board frame 4 will be described by using FIG. 6. FIG. 6 is a cross-sectional view along line C-C of the wiring board frame shown in FIG. 5. The wiring board frame 4 has surface wiring layers L1 and L3, and an intermediate wiring layer L2.

On the surface wiring layer L1, which is a wiring layer formed on the first surface 4s, terminals and wirings that are electrically connected to components that are mounted on the wiring board 40, such as terminals that are electrically connected to terminals not illustrated of the memory chips 10 and the controller chip 20, and the electrodes 41 that are electrically connected to the capacitors 30 are formed. On the surface wiring layer L1, the inspection path 42 and the inspection terminals 43 are also formed. The inspection terminals 43 are formed on only the first surface 70s of the gap region 70. The inspection path 42 is formed on both the first surface 40s of the wiring board 40 and the first surface 70s of the gap region 70. Note that the inspection path 42 and the inspection terminal 43 are not electrically connected to the other wirings and terminals (for example, the wirings and terminals that are electrically connected to the components mounted on the wiring board 40, such as the terminals of the memory chips 10 and the controller chip 20, and the electrodes 41 of the capacitor 30). Under the surface wiring layer L1, the intermediate wiring layer L2 is formed via a solder resist layer 46.

The intermediate wiring layer L2 is a multilayer wiring layer formed by a plurality of wiring layers being stacked. The terminals and wirings (terminals and wirings that are electrically connected to the components mounted on the wiring board 40) that are formed on the surface wiring layer L1, and wirings formed in the intermediate wiring layer L2 are electrically connected through vias 48. Among wirings formed by being stacked in the intermediate layer L2 (between wirings adjacent up and down), an insulation layer 45, or a core layer 44 is formed. The core layer 44 is a rigid plate-shaped member made of glass fiber and an epoxy resin, for example. Wirings formed on a top surface and an undersurface of the core layer 44 are electrically connected via any of through-hole wirings 47. The through-hole wiring 47 is a wiring that is buried in an open hole (through-hole) provided by penetrating the core layer 44. Wirings formed on a top surface and an undersurface of the insulation layer 45 are electrically connected through the vias 48. Under the intermediate wiring layer L2, the surface wiring layer L3 is formed via the solder resist layer 46. Note that FIG. 5 shows the wiring board frame 4 having the core layer 44, but it is also possible to use a so-called coreless board frame that does not have the core layer 44. In this case, a plurality of wirings formed in the intermediate wiring layer L2 are stacked with the insulation layers 45 interposed among the plurality of wirings, and the wirings are electrically connected through the vias 48.

The surface wiring layer L3 is a wiring layer formed on the second surface 4b, and lands 49 for connecting solder balls 50 as external terminals are formed. The wirings formed in the intermediate wiring layer L2 and the lands 49 are electrically connected through the vias 48. By a configuration like this, the memory chips 10 and the controller chip 20 are electrically connected to the solder balls 50 via each site of the wiring board 40. Note that the inspection path 42 and the inspection terminals 43 formed on the surface wiring layer L1 are not electrically connected to the other wirings and terminals (terminals and wirings electrically connected to the components mounted on the wiring board 40) formed on the surface wiring layer L1 via the intermediate wiring layer L2 and the surface wiring layer L3. The inspection path 42 and the inspection terminals 43 are not electrically connected to the solder balls 50, either.

On each of the wiring boards 40 of the wiring board frame 4 configured like this, the components such as the memory chips 10, the controller chip 20, and the capacitors 30 are mounted, and these components are electrically connected to the surface wiring layer L1 of the wiring board 40. After each of the wiring boards 40 is molded, and the solder balls 50 are connected to the lands 49, the peripheral edge of the wiring board 40 is cut by dicing, and the semiconductor devices 100 are divided. As a result that the wiring board 40 and the gap regions 70 are separated with thick lines in FIG. 6 as boundaries, parts formed in the gap regions 70, of the inspection path 42, and the inspection terminals 43 are separated from the semiconductor device 100. In other words, one end of the third wiring 42c located in the peripheral edge of the wiring board 40 shown in FIG. 3 is a cut end on a wiring board 40 side of the inspection path 42 generated by dicing.

Figure 7:
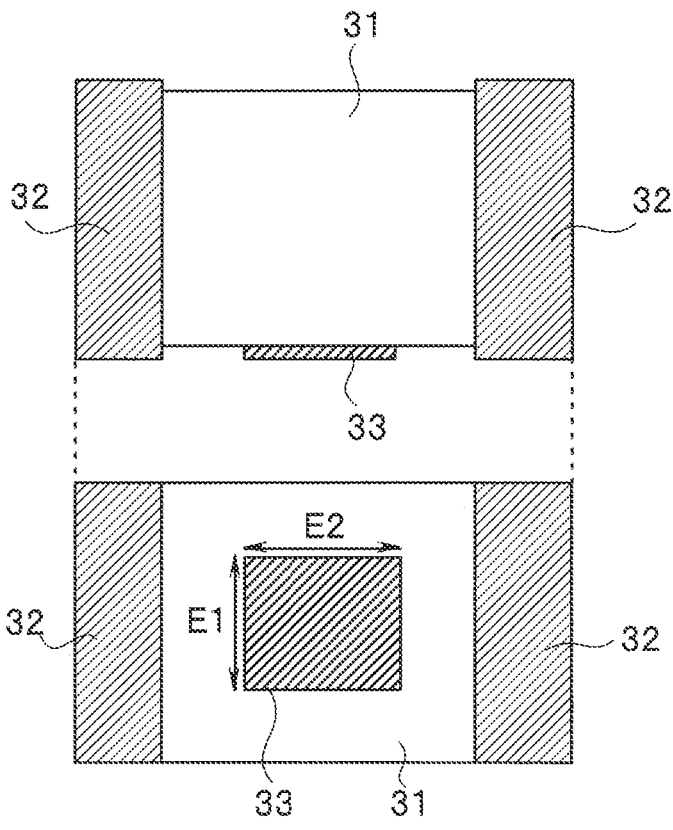
FIG. 7 is a view explaining an example of a configuration of the capacitor that is mounted on the semiconductor device of the embodiment.

Next, a structure of the capacitor 30 will be described. FIG. 7 is a view explaining an example of a configuration of the capacitor that is mounted on the semiconductor device of the embodiment. The capacitor 30 of the embodiment is a so-called multilayer ceramic capacitor having a structure in which dielectric layers and internal electrodes are stacked in multiple layers. FIG. 7 shows a side view (drawing on an upper side) and a bottom view (drawing on a lower side) of the capacitor 30. The capacitor 30 has a stacked body 31, external electrodes 32, and a conductor 33. The stacked body 31 is a sintered body having a stacked body structure in which ceramic dielectric layers and internal electrode layers are alternately stacked. The stacked body 31 is in a rectangular parallelepiped shape and has a rectangular bottom surface. The external electrodes 32 are external terminals that electrically connect the internal electrode layers of the stacked body 31, and the lands 41a and 41b formed on the wiring board 40. The external electrodes 32 are formed on end surfaces of the stacked body 31. The external electrodes 32 are also formed on parts of the bottom surface and a top surface by extending from the end surfaces. As the external electrode 32, for example, a copper (Cu) electrode is used. On a surface of the Cu electrode, a nickel (Ni)/tin (Sn) plating layer is formed. The conductor 33 is an electrode formed in a bottom surface center of the stacked body 31, and a shape of a surface is formed in a rectangular shape. The conductor 33 is formed between the two external electrodes 32 formed by including short sides facing each other of the bottom surface of the stacked body 31 to be separated from the two external electrodes 32. A length E1 of the conductor 33 in a direction parallel to a short side of the bottom surface of the stacked body 31 is longer than the distance D1 (distance between the terminal portions 42a and 42b facing each other). A length E2 of the conductor 33 in a direction parallel to a long side of the bottom surface of the stacked body 31 is longer than a width of the terminal portions 42a and 42b. As described later, the conductor 33 is connected to the wiring board 40 via a solder 61b. The solder 61b is likely to protrude from the conductor 33 when the capacitor 30 and the wiring board 40 are clamped. The length E2 of the conductor 33 is sufficiently shorter than the distance between the lands 41a and 41b so that the land 41a and the land 41b are not electrically connected via the solder 61b even in the case like this. The conductor 33 is formed of a same material as the external electrode 32, for example.

Figure 8A:
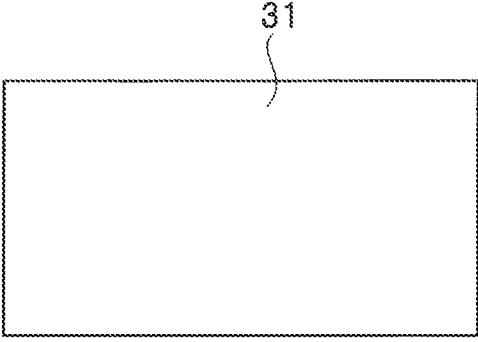
FIG. 8A is a view explaining a manufacturing process of the capacitor in FIG. 7.
Figure 8B:
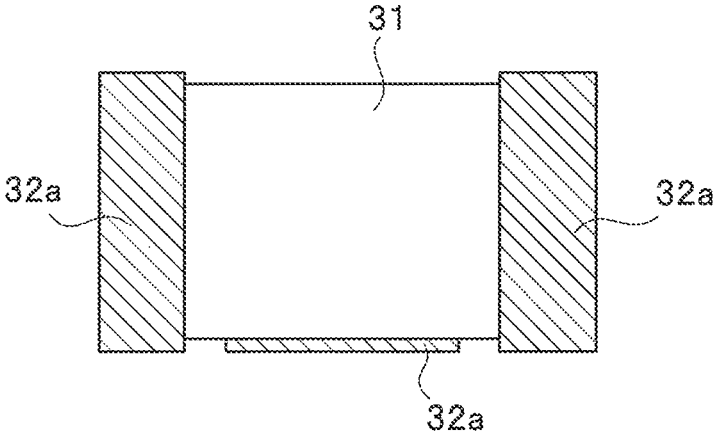
FIG. 8B is a view explaining the manufacturing process of the capacitor in FIG. 7.
Figure 8C:
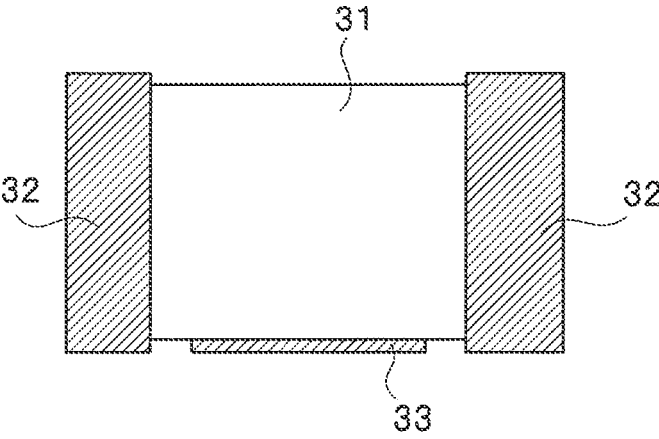
FIG. 8C is a view explaining the manufacturing process of the capacitor in FIG. 7.

FIG. 8A to FIG. 8C are views explaining a manufacturing process of the capacitor in FIG. 7. First, fine powder of dielectric ceramics is mixed with a solvent, a dispersant, a binder (binding agent) and the like to form a muddy slurry, and the muddy slurry is thinly spread on a carrier film to form a green sheet of a dielectric. Next, after the green sheets on which internal electrode patterns are screen-printed are stacked and clamped, the stacked and clamped green sheets are cut into a large number of individual chips, and the individual chips are sintered to be formed into ceramics to form each of the stacked bodies 31 (FIG. 8A). Next, Cu electrodes 32a are applied and baked on regions where the external electrodes 32 are formed on both the end surfaces of the stacked body 31, and a region where the conductor 33 is formed in a center of the bottom surface (FIG. 8B). Finally, Ni and Sn are sequentially stacked on surfaces of the Cu electrodes 32a by electrolytic plating to form the external electrodes 32 and the conductor 33, and thereby the capacitor 30 that is mounted on the semiconductor device 100 of the embodiment is completed (FIG. 8C).

Figure 9:
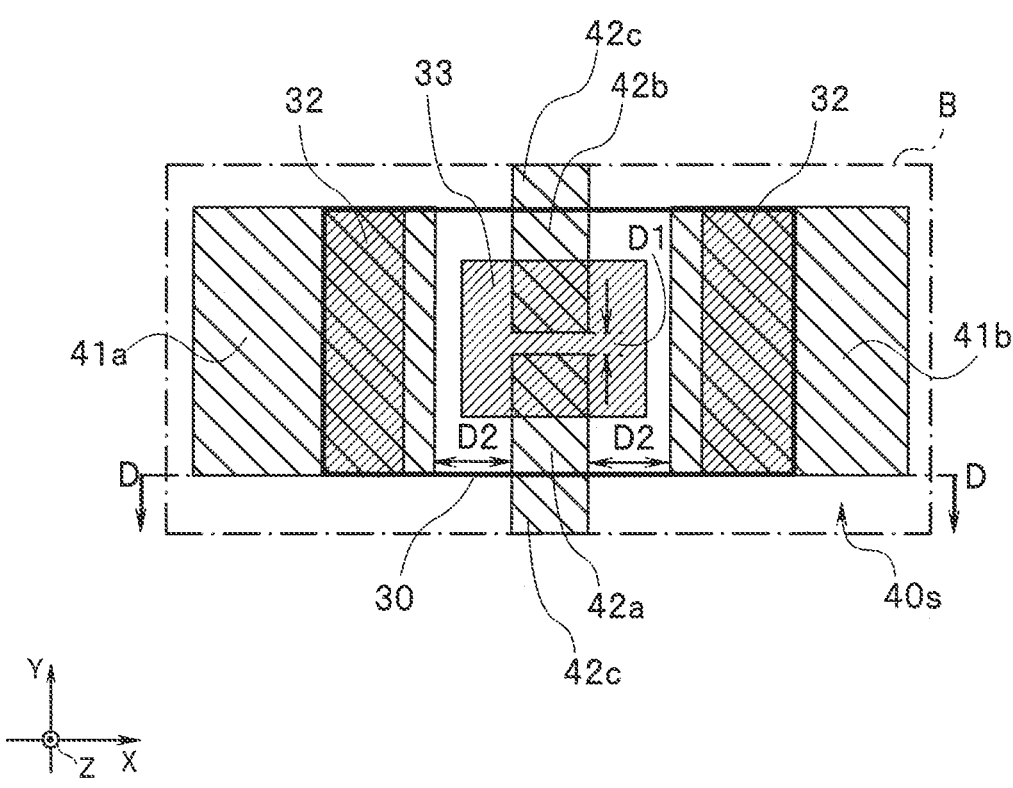
FIG. 9 is a plan view for explaining a positional relationship of the capacitor and the wiring board of the embodiment.
Figure 10:
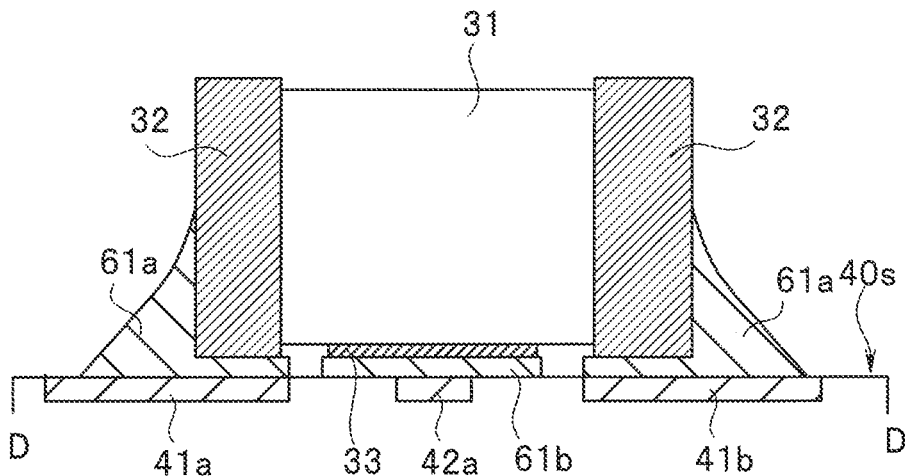
FIG. 10 is a cross-sectional view for explaining a configuration of a junction portion of the capacitor and the wiring board of the embodiment.
Figure 10:
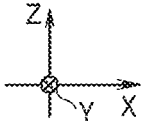

A junction region of the capacitor 30 and the wiring board 40 having the aforementioned structure will be described by using FIG. 9 and FIG. 10. FIG. 9 is a plan view for explaining a positional relationship of the capacitor and the wiring board of the embodiment. FIG. 9 shows an example of a positional relationship between constituent elements formed on the first surface 40s of the wiring board 40, and constituent elements formed on the bottom surface of the capacitor 30, and is a plan view of the rectangular region B surrounded by a dotted line in FIG. 3 in the first surface 40s of the wiring board 40. FIG. 10 is a cross-sectional view for explaining a configuration of a junction portion of the capacitor and the wiring board of the embodiment. FIG. 10 shows an example of a cross-section after the capacitor 30 is jointed to the wiring board 40 by solders 61a and 61b, and is a cross-sectional view along line D-D in FIG. 9.

As shown in FIG. 9, when the capacitor 30 is joined to the wiring board 40, a position of the capacitor 30 is determined so that in a direction parallel to a long side of the bottom surface of the capacitor 30 (X direction in FIG. 9), under-surfaces of the two external electrodes 32 are included in surfaces of the lands 41a and 41b respectively, one side facing the land 41a, of the conductor 33, is located on the first surface 40s between the land 41a and the inspection path 42, and one side facing the land 41b, of the conductor 33, is located on the first surface 40s between the inspection path 42 and the land 41b. When the capacitor 30 is jointed to the wiring board 40, the position of the capacitor 30 is determined so that in a direction parallel to the short side of the bottom surface of the capacitor 30 (Y direction in FIG. 9), the undersurfaces of the two external electrodes 32 are included in the surfaces of the lands 41a and 41b respectively, one side of the conductor 33 crosses the first wiring 42a, and one facing side of the conductor 33 crosses the second wiring 42b.

In other words, the respective two external electrodes 32 are arranged so as to be physically and electrically connected to the lands 41a and 41b, but not to be physically or electrically connected to the first wiring 42a and the second wiring 42b. The conductor 33 is arranged so as to be physically and electrically connected to the first wiring 42a and the second wiring 42b, but not to be physically or electrically connected to the lands 41a and 41b.

When mounting the capacitor 30 on the wiring board 40, there is a possibility that a misalignment may occur within a plane of the first surface 40s. The distance D1 between the first wiring 42a and the second wiring 42b is set so that even if the capacitor 30 is misaligned in the direction parallel to the short side of the bottom surface, the conductor 33 is arranged across both the first wiring 42a and the second wiring 42b. For example, the distance D1 is set to equal to or smaller than half the width of each of the lands 41a and 41b in the direction parallel to the short side of the bottom surface of the capacitor 30. The first wiring 42a and the second wiring 42b are likely to be formed with occurrence of an error corresponding to processing accuracy with respect to shapes in design. The distance D1 is set so that even if the first wiring 42a and the second wiring 42b are formed to be longer than the shapes in design, one end of the first wiring 42a and one end of the second wiring 42b do not contact each other and cause unintended conduction. For example, the distance D1 is set to 50 µm or more.

The distance D2 between the inspection path 42 and the lands 41a and 41b is set so that the conductor 33 does not contact the lands 41a and 41b even if the capacitor 30 is misaligned in a direction perpendicular to the short side of the bottom surface of the capacitor 30 (X direction in FIG. 9).

When the positions of the external electrodes 32 on the capacitor 30 bottom surface and the conductor 33 are positioned on the first surface 40s of the wiring board 40 as shown in FIG. 9, the first surface 40s of the wiring board 40 is covered with a mask material (for example, a screen printing plate) having an opening portion in a determined junction position, and cream solder in a paste form is applied from above the mask material. Subsequently, pressure is applied by a squeegee or the like to push out the cream solder from the opening portion, and the first surface 40s exposed from the opening portion of the mask material is printed (coated). The mask material is removed, the capacitor 30 is mounted on the cream solder, and is packaged by a reflow method. Since the cream solder has conductivity, the external electrodes 32 of the capacitor 30 and the lands 41a and 41b of the wiring board 40 are also connected electrically.

As shown in FIG. 10, the external electrodes 32 of the capacitor 30 are connected onto the surfaces of the land 41a and the land 41b formed on the first surface 40s of the wiring board 40 via a solder 61a (cream solder melted and solidified by reflow processing). One of the external electrodes 32 and the land 41a are physically and electrically connected, and the other external electrode 32 and the land 41b are physically and electrically connected, by the solder 61a that is formed into a fillet shape between the bottom surfaces of the external electrodes 32 and the lands 41a and 41b, and from the surfaces of the lands 41a and 41b to a predetermined height along the end surfaces of the capacitor 30. The conductor 33 and the first wiring 42a are physically and electrically connected by a solder 61b that is also formed between the conductor 33 formed on the bottom surface of the capacitor 30 and the first wiring 42a. By the solder 61b formed on the surface of the conductor 33, the second wiring 42b arranged in a paper surface back direction and the conductor 33 are physically and electrically connected. Note that the solder 61b is an example of an adhesive member.

In other words, when the capacitor 30 is connected to the electrode 41 via the solder 61a, the first wiring 42a and the second wiring 42b that are arranged to face each other in the direction orthogonal to the long side of the bottom surface of the capacitor 30 are electrically connected via the solder 61b and the conductor 33. When a physical poor connection occurs between the capacitor 30 and the electrode 41, one end of the first wiring 42a and one end of the second wiring 42b are not electrically connected.

As above, according to the present embodiment, the conductor 33 is provided between the external electrodes 32 on the capacitor 30 bottom surface. The inspection path 42 is provided on the first surface 4s of the wiring board frame 4. The inspection path 42 is arranged so that the conductors 33 formed on the respective capacitors 30 are connected in series by a daisy chain method, when all the capacitors 30 that are mounted on the respective wiring boards 40 are physically connected to the wiring boards 40. By the configuration like this, it is made possible to detect presence or absence of a poor connection (physical poor connection to the wiring boards 40) with respect to the capacitors 30 mounted on all the wiring boards 40 provided in the wiring board frame 4 collectively by measuring a resistance value between the inspection terminals 43a provided at both ends of the inspection path 42. Accordingly, it is possible to detect a poor connection of the capacitors and the wiring boards efficiently.

Since not only the external electrodes 32 and the lands 41a and 41b, but also the conductor 33 and the inspection path 42 are physically connected by the solder 61b, connection strength between the capacitor 30 and the wiring board 40 increases, and the capacitor 30 can be prevented from falling off from the wiring board 40. Therefore, an effect of improving a yield of the semiconductor devices can also be obtained.

Figure 11A:
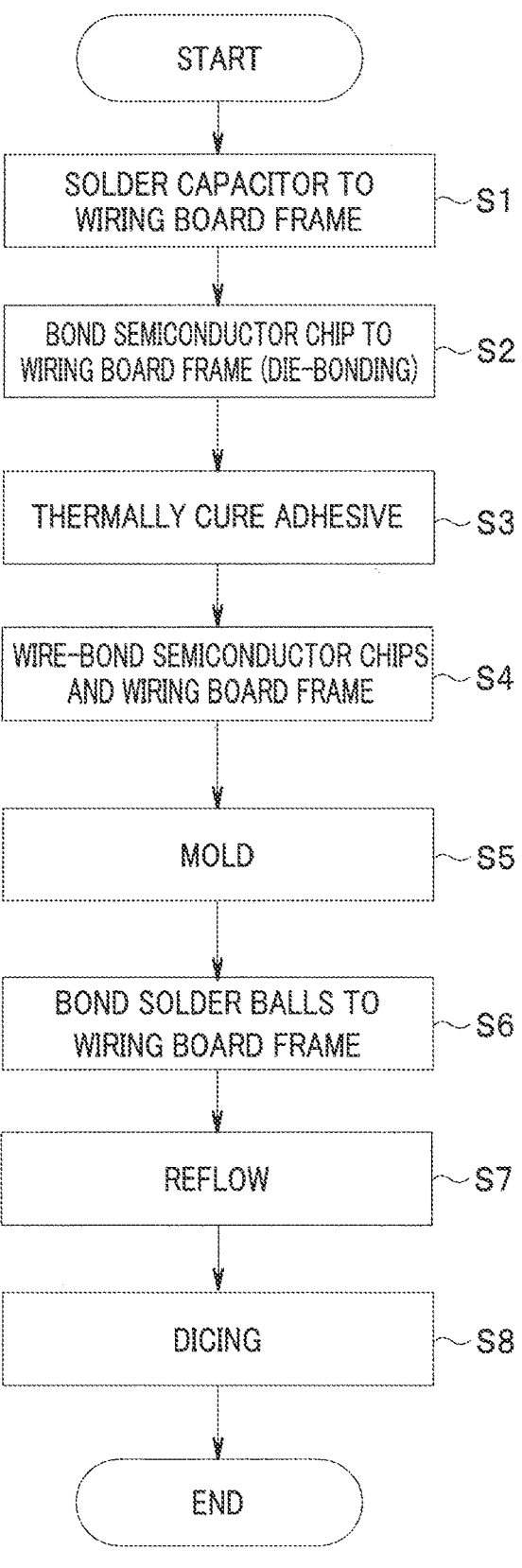
FIG. 11A is a flowchart explaining an example of a manufacturing process of the semiconductor device of the embodiment.

Next, a method for manufacturing the semiconductor device 100 of the embodiment will be descried. FIG. 11A is a flowchart explaining an example of a manufacturing process of the semiconductor device of the embodiment. First, the capacitors 30 are soldered to all the electrodes 41 of the wiring boards 40 formed in the wiring board frame 4 to physically connect the wiring boards 40 and the capacitors 30, and the external electrodes 32 of the capacitors 30 and the surface wiring layers L1 of the wiring boards 40 are electrically connected (S1). When the semiconductor devices are manufactured by using the wiring board frame 4 on which the capacitors 30 are mounted, S1 is omitted.

Next, with respect to each of all the wiring boards 40 formed in the wiring board frame 4, a back surface of the memory chip 10 is bonded to the region 410 of the first surface 40s, and a back surface of the controller chip 20 is bonded to the region 420 of the first surface 40s (S2). Step S2 is a step referred to as so-called die bonding. The region 410 of the first surface 40s of the wiring board 40 and the back surface of the memory chip 10, and the region 420 and the back surface of the controller chip 20 are bonded by using a non-conductive adhesive such as a die attach film (die attach film; DAF), for example. When a plurality of memory chips 10 are formed by being stacked as shown in FIG. 1A, DAF is also used in bonding of the memory chips 10 that are adjacent up and down.

Subsequently, the wiring board frame 4 is heated in an oven to cure the above descried adhesive (S3). The terminals of the memory chips 10 and the controller chips 20 are connected to the terminals of the surface wiring layers L1 of the wiring boards 40 by using metal wires of gold (Au) or the like (S4). Step S4 is a step referred to as so-called wire bonding.

Next, the wiring board frame 4 is sealed with resin (S5). Step S5 is a step referred to as so-called mold. In S5, resin sealing of the plurality of wiring boards 40 formed in the wiring board frame 4 is performed collectively. Subsequently, the solder balls 50 that are external terminals are bonded to the lands 49 formed on the surface wiring layer L3 of the wiring board frame 4 by using a conductive adhesive such as solder paste (S6). Subsequently, the wiring board frame 4 is heated by reflow processing to fixedly attach the lands 49 and the solder balls 50 (S7). Finally, the wiring boards 40 and the gap region 70 are cut off from one another to be divided into the individual semiconductor devices 100 (S8). Step S8 is a step referred to as so-called dicing. By carrying out the above steps, the semiconductor devices 100 of the embodiment are manufactured. It is possible to perform measurement of the DC resistance value by using the inspection terminals 43 formed in the gap region 70 of the wiring board frame 4 during a period until the wiring board frame 4 is diced after the capacitors 30 are mounted on the wiring board frame 4.

Figure 11B:
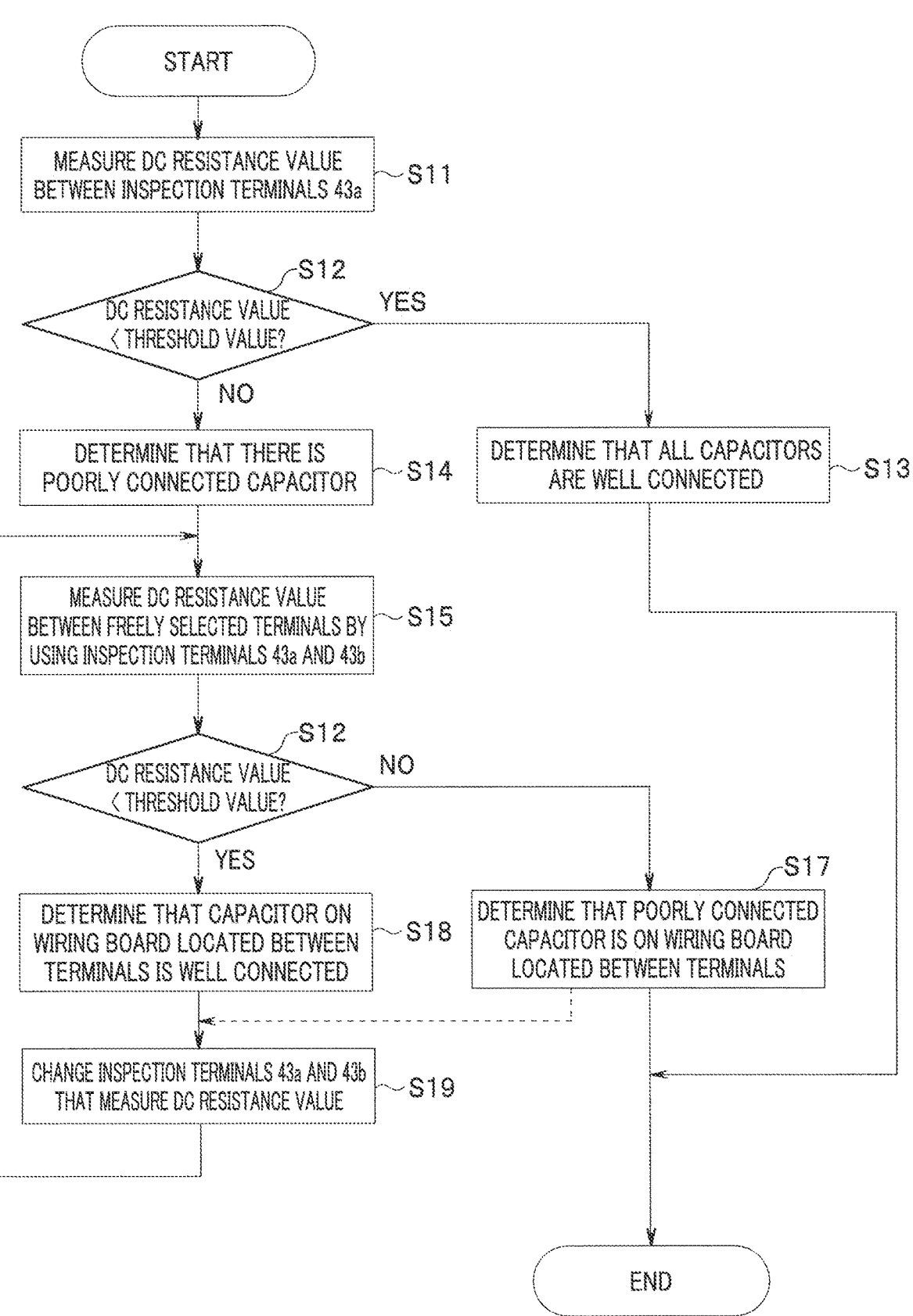
FIG. 11B is a flowchart explaining an example of a process of inspecting a physical connection state of capacitors mounted on the wiring board frame of the embodiment.

FIG. 11B is a flowchart explaining an example of a process of inspecting a physical connection state of the capacitors 30 mounted on the wiring board frame 4 of the embodiment. First, the DC resistance value between the inspection terminals 43a formed at both ends of the inspection path 42 is measured (S11). When the DC resistance value is lower than a set threshold value (S12, YES), it is determined that all the capacitors 30 mounted on the wiring board frame 4 are physically connected to the wiring boards 40 (S13), and inspection is ended.

When the DC resistance value is equal to or larger than the set threshold value (S12, NO), it is determined that a physical poor connection occurs in any of the capacitors 30 (S14). A DC resistance value between freely selected terminals is measured by also using the inspection terminals 43b formed midway in the inspection path 42 in addition to the inspection terminals 43a. When the DC resistance value is smaller than the set threshold value (S16, YES), it is determined that the capacitor 30 on the wiring board 40 located between the terminals used in measurement in S15 is physically connected to the wiring board 40 (S18). In order to detect the capacitor in which a poor connection occurs, the inspection terminals 43a and 43b for measurement are changed (S19), and the flow returns to S15 to measure a DC resistance value between the terminals. When the DC resistance value is equal to or larger than the set threshold value (S16, NO), it is determined that there is the capacitor 30 in which a physical poor connection occurs among the capacitors 30 on the wiring boards 40 located between the terminals used in measurement in S15 (S17), and inspection is ended. When the wiring board 40 on which the capacitor 30 with occurrence of a physical poor connection is mounted is further narrowed down, the flow returns to S19 to change the inspection terminals 43a and 43b for measurement, and inspection is continued.

As above, according to the semiconductor device of the embodiment, it is possible to efficiently detect the physical poor connection of the capacitor 30 and the wiring board 40 at a freely selected timing in a time period until execution of S8 after execution of S1, in the aforementioned manufacturing process.

For example, inspection is performed between S1 and S2, and if there is the capacitor 30 in which a poor connection occurs, a location of the capacitor 30 (on which wiring board 40, the capacitor 30 is mounted) is identified. It is possible to reduce an amount of use of the memory chips 10 and the controller chips 20 and reduce cost, by not mounting members such as the memory chips 10 and the controller chip 20 on the wiring board 40 where a poor connection with the capacitor 30 occurs, in the steps after S2. For example, by performing inspection between S7 and S8, it is possible to detect a poor connection (tombstone, a detachment or the like) of the capacitor 30 that occurs due to stress or the like due to a history of heat applied to a product, in the steps up to S7. When a poor connection occurs, it is possible to identify in which wiring board 40 the poor connection occurs. Since it is possible to exclude a semiconductor device where a poor connection occurs after the semiconductor devices are divided in S8, it is possible to narrow down the semiconductor devices for which a production test is performed, and it is possible to realize cost reduction and reduction of a test time period.

Figure 12:
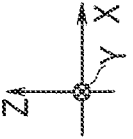
FIG. 12 is a cross-sectional view explaining another arrangement of the inspection path in the wiring board frame of the embodiment.

Note that in the aforementioned semiconductor device, the inspection path 42 is formed on only the surface wiring layer L1 of the wiring board frame 4, but the inspection path 42 other than the first wiring 42a and the second wiring 42b may be formed on the intermediate wiring layer L2. FIG. 12 is a cross-sectional view explaining another arrangement of the inspection path in the wiring board frame of the embodiment. As shown in FIG. 12, for example, the third wiring 42c may be formed on an uppermost layer of the intermediate wiring layer L2, and electrically connected to the first wiring 42a, the second wiring 42b and the inspection terminal 43 formed on the surface wiring layer L1 through the vias 48. Note that the third wiring 42c may be formed across the surface wiring layer L1 and the intermediate wiring layer L2 as shown in FIG. 12, or may be formed on only the intermediate wiring layer L2. The third wiring 42c may be formed on a layer other than the uppermost layer of the intermediate wiring layer L2, or across a plurality of layers. By forming at least a part of the third wiring 42c on the intermediate wiring layer L2 like this, a degree of freedom of wiring design increases. Therefore, even when a space for forming the inspection path 42 on the first surface 40s of the wiring board 40 is limited, the inspection path 42 can be arranged reliably.

Figure 13:
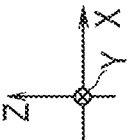
FIG. 13 is a cross-sectional view explaining another arrangement of the inspection path and inspection terminals in the wiring board frame of the embodiment.

In the aforementioned semiconductor device, the inspection terminals 43 are formed on the surface wiring layer L1 of the wiring board frame 4, but may be formed on the surface wiring layer L3. FIG. 13 is a cross-sectional view explaining another arrangement of the inspection wiring and the inspection terminals in the wiring board frame of the embodiment. As shown in FIG. 13, the inspection terminals 43 may be formed on the surface wiring layer L3, and electrically connected to the third wiring 42c formed on the surface wiring layer L1 via a through-hole wiring 471. By forming the inspection terminal 43 on the surface wiring layer L3, and exposing the inspection terminal 43 from the second surface 4b of the wiring board frame 4 in this way, it is possible to reliably perform inspection of presence or absence of a poor connection of the capacitor 30 and the wiring board 40 even after the first surface 40s of the wiring board 40 is covered with mold resin 60. Note that when the inspection terminal 43 is formed on the surface wiring layer L3, a part or a whole of the third wiring 42c may also be formed on the intermediate wiring layer L2 as described above.

Figure 14A:
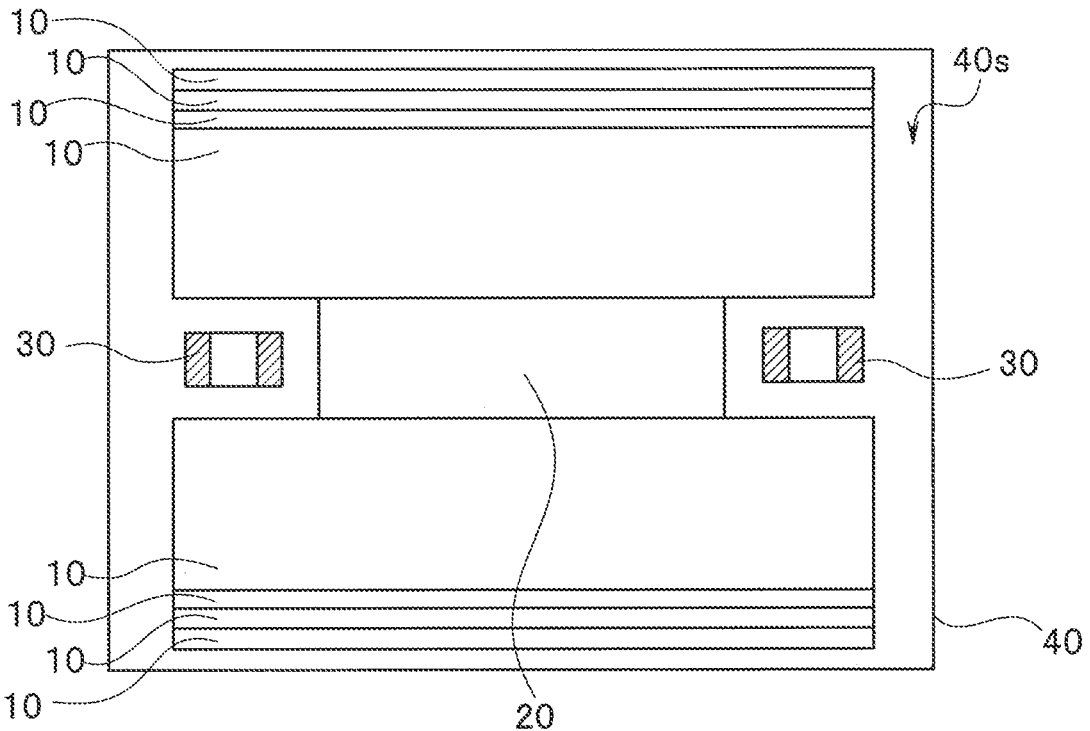
FIG. 14A is a schematic view explaining another example of the arrangement of semiconductor chips and the capacitors that are mounted on the wiring board of the embodiment, which is a top view of the wiring board on which the semiconductor chips and the capacitors are arranged seen from above the first surface.
Figure 14A:
Figure 14B:
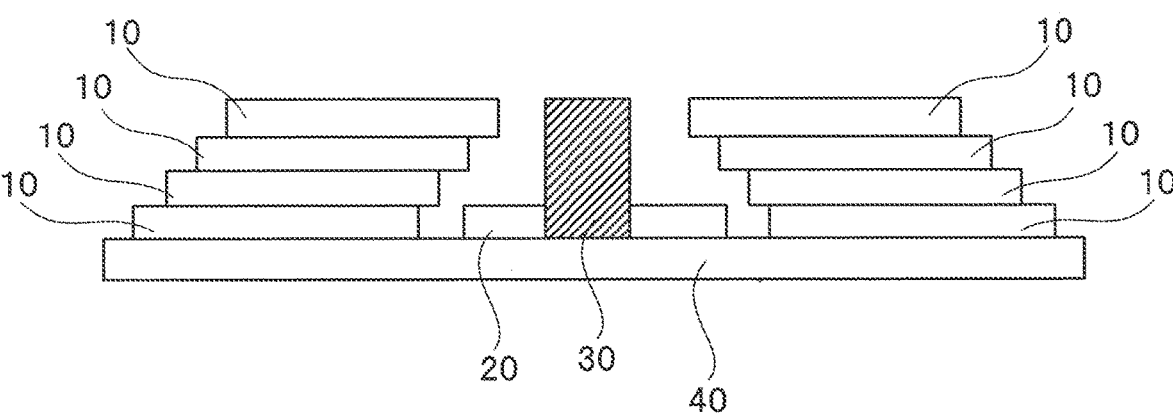
FIG. 14B is a schematic view explaining the other example of the arrangement of the semiconductor chips and the capacitors that are mounted on the wiring board of the embodiment, which is a side view of the wiring board on which the semiconductor chips and the capacitors are arranged seen from a front side in the X direction.
Figure 14B:
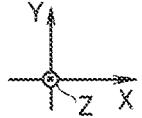

The numbers of the memory chips 10 and the capacitors 30 that are mounted on the wiring board 40, and arrangements of the memory chips 10, the controller chip 20, and the capacitors 30 on the first surface 40s are not limited to the numbers and the arrangements shown in FIGS. 2A and 2B. FIGS. 14A and 14B are views explaining another example of the arrangements of the semiconductor chips and capacitors that are mounted on the wiring board of the embodiment. FIG. 14A is a top view of the wiring board on which the semiconductor chips and the capacitors are arranged seen from above the first surface. FIG. 14B is a side view of the wiring board on which the semiconductor chips and the capacitors are arranged seen from one side in the X direction (right side in FIG. 14A). In a configuration shown in FIGS. 14A and 14B, a memory chip group in which four memory chips 10 are stacked while being slightly shifted from one another is arranged on each of both sides in the Y direction, of the controller chip 20, and one capacitor 30 is arranged on each of both sides of the controller chip 20 in the X direction. The capacitors 30 can be arranged in available spaces where the memory chips 10 and the controller chip 20 are not arranged in this way, and positions where the capacitors 30 are installed on the wiring board 40 can be designed freely. A freely selected number of the capacitors 30 can be mounted according to an area of the available space in which the capacitors 30 can be installed on the first surface 40s of the wiring board 40, and a capacity required for operation of the semiconductor device 100.

Figure 15:
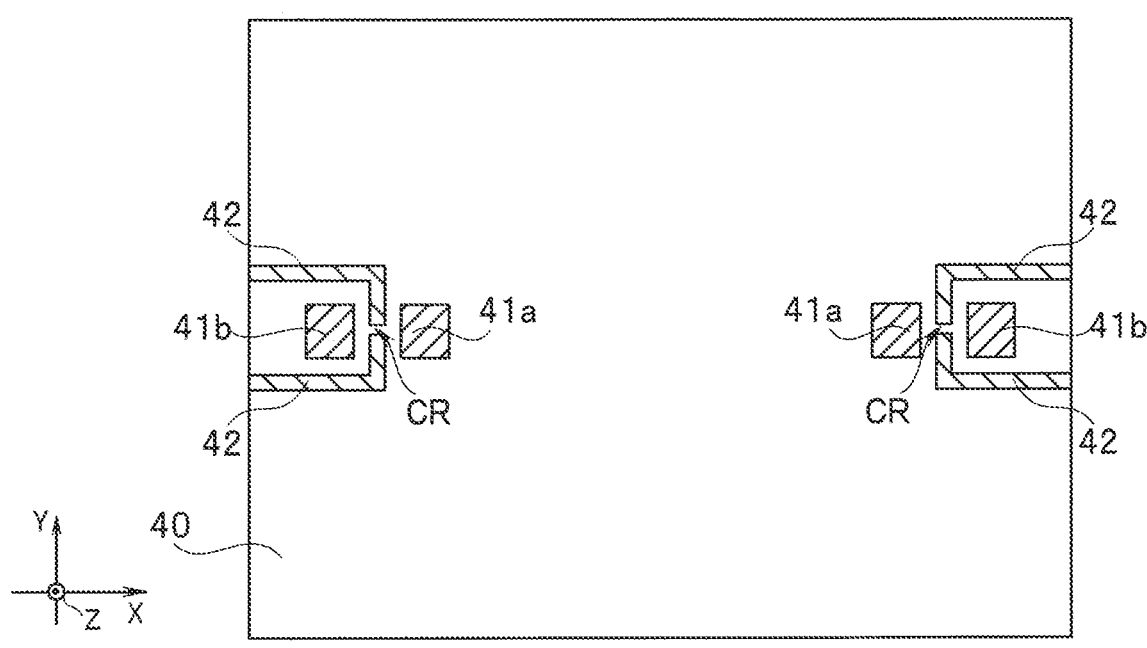
FIG. 15 is a plan view explaining another example of the arrangement of the inspection path in the wiring board of the embodiment.

FIG. 15 is a plan view explaining another example of the arrangement of the inspection wiring in the wiring board of the embodiment. FIG. 15 shows the arrangement of the inspection path on the wiring board in which the semiconductor chips and the capacitors are arranged as shown in FIGS. 14A and 14B. As shown in FIG. 15, on the first surface 40s of the wiring board 40, two pairs of lands 41a and 41b for connecting the capacitors 30 to the wiring board 40 are formed. The lands 41a and 41b are formed on positions where the external electrodes 32 of the capacitor 30 are installed, in the first surface 40s. The lands 41a and 41b are arranged by being separated along a long side direction of the bottom surface of the capacitor 30 installed on top portions. The inspection path 42 is formed by being extended in a direction perpendicular to a direction in which the lands 41a and 41b are aligned (direction parallel to the long side of the bottom surface of the capacitor 30 installed on the top portions of the lands 41a and 41b), between the land 41a and the land 41b.

Figure 16:
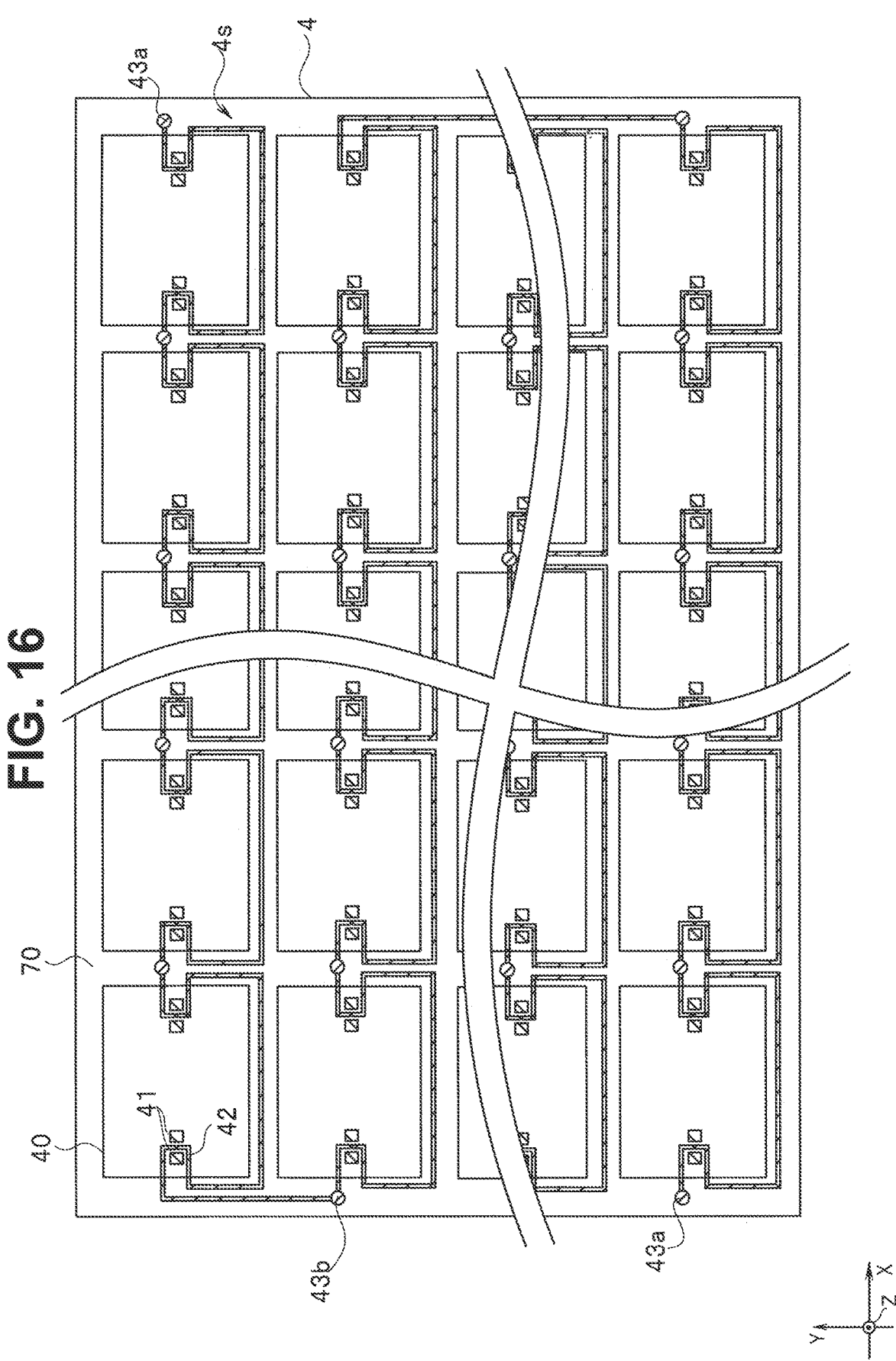
FIG. 16 is a plan view explaining another example of the arrangement of the inspection path in the wiring board frame of the embodiment.

FIG. 16 is a plan view explaining another example of the layout of the inspection path in the wiring board frame of the embodiment. FIG. 16 shows the wiring board frame 4 for forming multiple wiring boards in which the wiring boards 40 one of which is shown in FIG. 15 are disposed in a matrix form. Even if the positions and the number of the capacitors 30 that are mounted on the wiring board 40 differ, it is possible to form the inspection path 42 so that the inspection path 42 is a single wiring without branches when one end of the first wiring 42a and one end of the second wiring 42b facing each other are electrically connected, in the first surface 4s of the wiring board frame 4.

Figure 17:
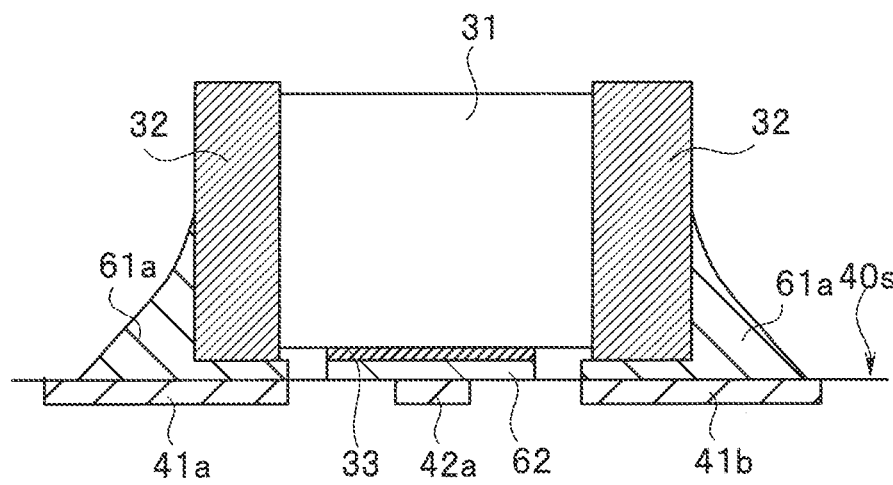
FIG. 17 is a cross-sectional view for explaining another configuration of the junction portion of the capacitor and the wiring board of the embodiment.
Figure 17:

In the aforementioned semiconductor device 100, as the component that causes the first wiring 42a and the second wiring 42b to electrically continue to each other, the conductor 33 is formed of a same material as the material of the external electrodes 32, on the bottom surface of the capacitor 30, and the first wiring 42a, the second wiring 42b and the first surface 40s are connected by using the solder 61b, but an adhesive material other than the solder 61b may be used as long as the material has conductivity. FIG. 17 is a cross-sectional view for explaining another configuration of the junction portion of the capacitor and the wiring board of the embodiment. In a configuration shown in FIG. 17, the conductor 33 formed on the bottom surface of the capacitor 30, and the first wiring 42a, the second wiring 42b and the first surface 40s are connected by using an anisotropic conductive film (ACF) 62. As compared with the solder 61b, the anisotropic conductive film 62 is less likely to change in shape even when heat or pressure is applied. Therefore, even if pressure or heat is applied after the capacitor 30 is bonded to the wiring board 40, it is possible to maintain a state in which the anisotropic conductive film 62 and the land 41a, and the anisotropic conductive film 62 and the land 41b are separated, and it is possible to reliably prevent the lands 41a and 41b from being electrically connected. Note that the anisotropic conductive film 62 is an example of the adhesive member.

Figure 18:
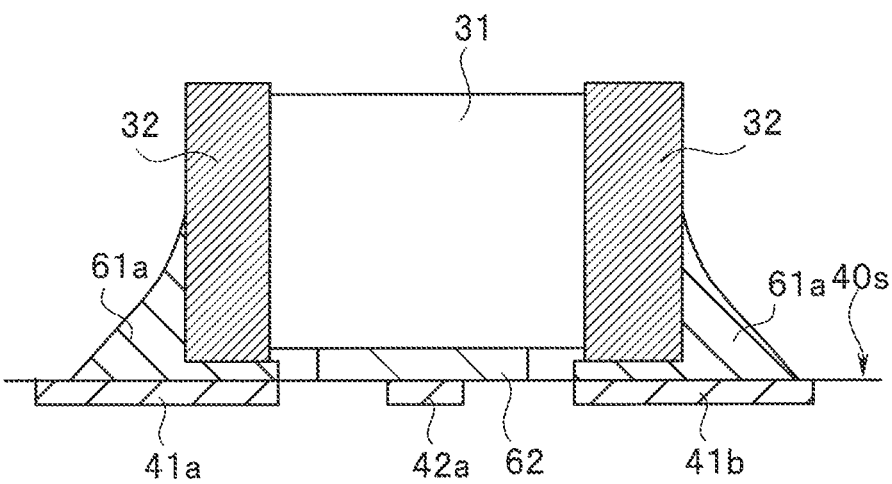
FIG. 18 is a cross-sectional view for explaining still another configuration of the junction portion of the capacitor and the wiring board of the embodiment.
Figure 18:
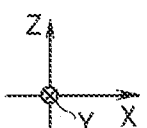

FIG. 18 is a cross-sectional view for explaining still another configuration of the junction portion of the capacitor and the wiring board of the embodiment. In a configuration shown in FIG. 18, the capacitor 30, and the first wiring 42a, the second wiring 42b and the first surface 40s are connected via the anisotropic conductive film 62 without forming the conductor 33 on the bottom surface of the capacitor 30. As above, it is possible to change the member that is provided on the bottom surface of the capacitor 30 so that the one end of the first wiring 42a and the one end of the second wiring 42b are electrically connected in the state in which the capacitor 30 is physically connected to the wiring board 40, to another material having conductivity.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
a wiring board including a first surface and a second surface that is on an opposite side to the first surface;
a semiconductor chip provided on the first surface of the wiring board;
an electronic component connected to a pair of electrodes provided on the first surface of the wiring board;
sealing resin covering the first surface of the wiring board and surfaces of the semiconductor chip and the electronic component;
an external equipment connecting terminal provided on the second surface of the wiring board; and
a plurality of wirings, each of the plurality of wirings including a first end, a second end, and a side surface orthogonal to the first surface and the second surface of the wiring board, the first end being on the side surface, and the second end being located between the pair of electrodes,
wherein:
the plurality of wirings include a first wiring and a second wiring, and
between the pair of electrodes, the second end of the first wiring and the second end of the second wiring are formed to be separated from each other.
2. The semiconductor device according to claim 1, wherein:

the wiring board includes a plurality of wiring layers formed by being stacked between the first surface and the second surface, the plurality of wiring layers include an uppermost layer, the uppermost layer is formed to be exposed from the first surface, and each of the plurality of wirings includes at least a part formed between the pair of electrodes, the part being formed on the uppermost layer.

3. The semiconductor device according to claim 2, wherein the electronic component is physically connected to the first wiring and the second wiring by an adhesive member having conductivity.

4. The semiconductor device according to claim 3, wherein:

a conductor is formed on a surface facing the wiring board, of the electronic component, and the conductor is electrically connected to the first wiring and the second wiring via the adhesive member.

5. The semiconductor device according to claim 4, wherein the electronic component is a capacitor.

\* \* \* \* \*